United States Patent
Xiong et al.

(10) Patent No.: US 10,121,840 B2
(45) Date of Patent: Nov. 6, 2018

(54) ACTIVE MATRIX ORGANIC LIGHT EMITTING DIODE PANEL AND METHOD FOR MANUFACTURING THE SAME

(71) Applicant: SHANGHAI TIANMA MICRO-ELECTRONICS CO., LTD, Shaghai (CN)

(72) Inventors: Zhiyong Xiong, Shanghai (CN); Bengang Zhao, Shanghai (CN)

(73) Assignee: SHANGHAI TIANMA MICRO-ELECTRONICS CO., LTD., Shanghai (CN)

( * ) Notice: Subject to any disclaimer, the term of this patent is extended or adjusted under 35 U.S.C. 154(b) by 0 days.

(21) Appl. No.: 15/462,135

(22) Filed: Mar. 17, 2017

(65) Prior Publication Data

US 2017/0194391 A1 Jul. 6, 2017

Related U.S. Application Data

(63) Continuation-in-part of application No. 14/086,613, filed on Nov. 21, 2013, now Pat. No. 9,627,447.

(30) Foreign Application Priority Data

Dec. 7, 2012 (CN) .......................... 2012 1 0526005

(51) Int. Cl.
*H01L 27/32* (2006.01)
(52) U.S. Cl.
CPC ...... *H01L 27/3258* (2013.01); *H01L 27/3216* (2013.01)
(58) Field of Classification Search
None
See application file for complete search history.

(56) References Cited

U.S. PATENT DOCUMENTS

| 7,825,584 | B2* | 11/2010 | Kim ..................... H01L 27/3218 313/498 |
| 2004/0217694 | A1* | 11/2004 | Cok ..................... G09G 3/3216 313/504 |
| 2005/0173700 | A1* | 8/2005 | Liao ..................... H01L 27/3211 257/40 |

OTHER PUBLICATIONS

Final Rejection of U.S. Appl. No. 14/086,613, filed Aug. 19, 2016.*

* cited by examiner

*Primary Examiner* — Telly Green
(74) *Attorney, Agent, or Firm* — Alston & Bird LLP

(57) ABSTRACT

The disclosure discloses an active matrix organic light emitting diode panel and a method for manufacturing the same. The active matrix organic light emitting diode panel includes: a substrate, an organic film formed on the substrate, and a plurality of red, green and blue organic light emitting diodes formed on the organic film. A first recess or a first protrusion is formed in the organic film in a region corresponding to the blue organic light emitting diode. The blue organic light emitting diode is formed on the first recess or first protrusion, and a contact area of the blue organic light emitting diode with the organic film is $$\frac{S_{r0}}{\sqrt[n]{\frac{Lifetime_{b0}}{Lifetime_{r0}}}}$$

times as great as a contact area of the red organic light emitting film with the organic film, wherein n is a value ranging from 1.4 to 1.6.

13 Claims, 8 Drawing Sheets

ACTIVE MATRIX ORGANIC LIGHT EMITTING DIODE PANEL AND METHOD FOR MANUFACTURING THE SAME

CROSS REFERENCE TO RELATED APPLICATION

This application is a continuation-in-part of U.S. patent application Ser. No. 14/086,613, filed on Nov. 21, 2013, which claims the benefit of priority to Chinese Patent Application No. 201210526005.9, entitled "ACTIVE MATRIX ORGANIC LIGHT EMITTING DIODE PANEL AND METHOD FOR MANUFACTURING THE SAME", filed on Dec. 7, 2012 with the State Intellectual Property Office of People's Republic of China. The entire disclosures of the above applications are incorporated herein by reference.

BACKGROUND

An active matrix organic light emitting diode (AMOLED) panel is far superior to a thin-film technology liquid crystal display (TFT LCD) in picture quality, efficiency and cost. As for the display efficiency, the response speed of the AMOLED is faster, the contrast of the AMOLED is higher and the viewing angle of the AMOLED is broader. In addition, the AMOLED has a feature of self-luminous, whereby no backlight source is needed and the AMOLED can be lighter, thinner and more energy efficient than the TFT. Therefore, the AMOLED is referred to as the next generation of display technology.

Generally, as shown in FIG. 1, an AMOLED panel 100 includes: a substrate 101 and a plurality of pixels 102 formed on the substrate 101. The pixel 102 includes a red organic light emitting diode 1021, a green organic light emitting diode 1022 and a blue organic light emitting diode 1023. In general, the areas of the red organic light emitting diode 1021, the green organic light emitting diode 1022 and the blue organic light emitting diode 1023 are equal. However, the lifetime of the blue organic light emitting diode is typically shorter, as shown in FIG. 2, because the lifetime of the blue organic light emitting diode has stronger dependency with the current density thereof. The greater the current density is, the shorter the lifetime of the blue organic light emitting diode is, while the smaller the current density is, the longer the lifetime of the blue organic light emitting diode is, as shown in FIG. 3. In order to prolong the lifetime of the blue organic light emitting diode, the blue organic light emitting diode 1023 having large bottom area is typically manufactured and the current density thereof is reduced to prolong the lifetime of the blue organic light emitting diode such that the service life of the whole AMOLED is prolonged.

However, as shown in FIG. 4, in the case where the bottom area of the blue organic light emitting diode is increased, the area of the whole pixel tube 102 is also increased, causing the resolution of the whole AMOLED panel to be reduced. That is, the prolonging of the service life of the AMOLED is at the expense of compromising the resolution of the AMOLED panel.

SUMMARY

The present disclosure provides an active matrix organic light emitting diode panel, including: a substrate; a patterned layer comprising thin film transistors (TFTs) on the substrate, divided into red, green, and blue regions; a passivation layer disposed on the patterned layer; an organic film formed on the substrate; and a plurality of red, green and blue organic light emitting diodes formed on the organic film; wherein a first recess or a first protrusion is formed in the organic film in a region corresponding to the blue organic light emitting diode, the blue organic light emitting diode is formed on the first recess or the first protrusion, and a contact area of the blue organic light emitting diode with the organic film is $$\frac{S_{r0}}{\sqrt[n]{\frac{Lifetime_{b0}}{Lifetime_{r0}}}}$$

times as great as a contact area of the red organic light emitting diode with the organic film, wherein the $S_{r0}$ represents the contact area of the red organic light emitting diode with the organic film, $Lifetime_{r0}$ represents a lifetime of the red organic light emitting diode in a case that the contact area of the red organic light emitting diode with the organic film is $S_{r0}$; $Lifetime_{b0}$ represents a lifetime of the blue organic light emitting diode in a case that the contact area of the blue organic light emitting diode with the organic film is $S_{r0}$; and n is a value ranging from 1.4 to 1.6.

The disclosure further provides a method for manufacturing an active matrix organic light emitting diode panel, including: providing a substrate; forming an organic film on the substrate; exposing the organic film with a gray-tone mask; etching to remove part of the organic film and forming a first recess or a first protrusion on the organic film; and forming a plurality of red, green and blue organic light emitting diodes on the organic film; wherein the blue organic light emitting diode is formed on the first recess or the first protrusion, and a contact area of the blue organic light emitting diode with the organic film is $$\frac{S_{r0}}{\sqrt[n]{\frac{Lifetime_{b0}}{Lifetime_{r0}}}}$$

times as great as a contact area of the red organic light emitting film with the organic film, wherein the $S_{r0}$ represents the contact area of the red organic light emitting film with the organic film, $Lifetime_{r0}$ represents a lifetime of the red organic light emitting film in a case that the contact area of the red organic light emitting film with the organic film is $S_{r0}$; $Lifetime_{b0}$ represents a lifetime of the blue organic light emitting film in a case that the contact area of the blue organic light emitting film with the organic film is $S_{r0}$; and n is a value ranging from 1.4 to 1.6.

In the active matrix organic light emitting diode panel provided in the present disclosure, the first recess or protrusion is formed in the organic film in the region corresponding to the blue organic light emitting diode, and the blue organic light emitting diode is formed on the first recess or protrusion for which the surface area is larger than or equal to the contact area of the red or green organic light emitting diode with the organic film. The blue organic light emitting diode is formed on the first recess or protrusion, that is, the contact area of the blue organic light emitting diode with the organic film depends on the surface area of the recess or protrusion. Therefore, in the case where the surface area of the recess or protrusion is larger than the contact area of the red or green organic light emitting diode with the organic film, the contact area of the blue organic light emitting diode with the organic film is relatively increased and the current density of the blue organic light emitting diode may be reduced accordingly, so that the lifetime of the blue organic light emitting diode is prolonged. Since the increase in the contact area of the blue organic light emitting diode with the organic film may be implemented simply by increasing the surface area of the recess or protrusion without increasing the opening area of the recess or the bottom surface area of the protrusion, the size of the pixel can be maintained as it is, that is, the contact area of the blue organic light emitting diode with the organic film is increased without changing the resolution, and the service life of the whole AMOLED is improved.

DETAILED DESCRIPTION

In an embodiment of the present disclosure, a blue organic light emitting diode and/or green organic light emitting diode is formed on a recess or protrusion and the contact area of the blue and/or green organic light emitting diode with an organic film below the blue and/or green organic light emitting diode is changed by changing the surface area of the recess or protrusion. In the case where the surface area of the recess or protrusion is larger than the contact area of the red organic light emitting diode with the organic film, the contact area of the blue and/or green organic light emitting diode with the organic film is relatively increased and the current density therein may be reduced accordingly, thus the lifetime of the blue and/or green organic light emitting diode and hence the service life of the whole AMOLED are prolonged without compromising the resolution of the whole AMOLED.

In the following, a method for manufacturing an active matrix organic light emitting diode panel according to an embodiment of the present disclosure will be described in detail in conjunction with FIG. 5 to FIG. 12. In the embodiment, only the contact area of the blue organic light emitting diode with the organic film is enlarged. In other embodiment, the contact area of the green organic light emitting diode with the organic film may also be enlarged in a similar way.

Figure 5:
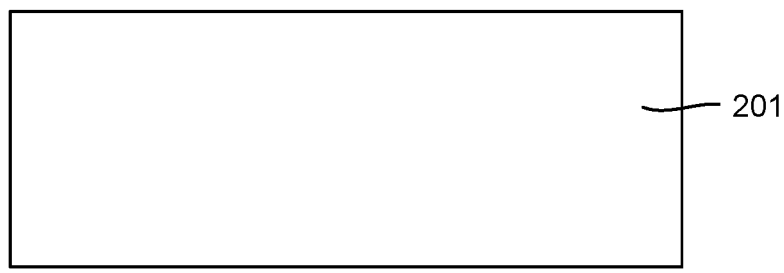
FIG. 5 to FIG. 12 are sectional views of an active matrix organic light emitting diode panel in the manufacturing process according to an embodiment of the present disclosure.

Firstly, as shown in FIG. 5, a substrate 201 is provided. The substrate 201 typically is a transparent glass substrate.

Figure 6:
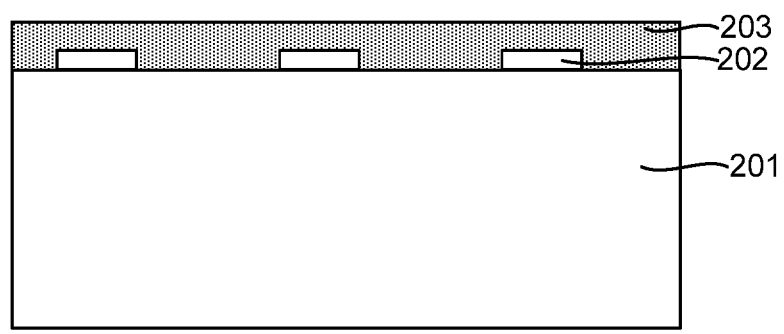

Next, as shown in FIG. 6, a plurality of thin film transistors 202 are formed on the substrate 201, and a passivation layer 203 is formed on the thin film transistors 202 and the substrate 201.

Figure 7:
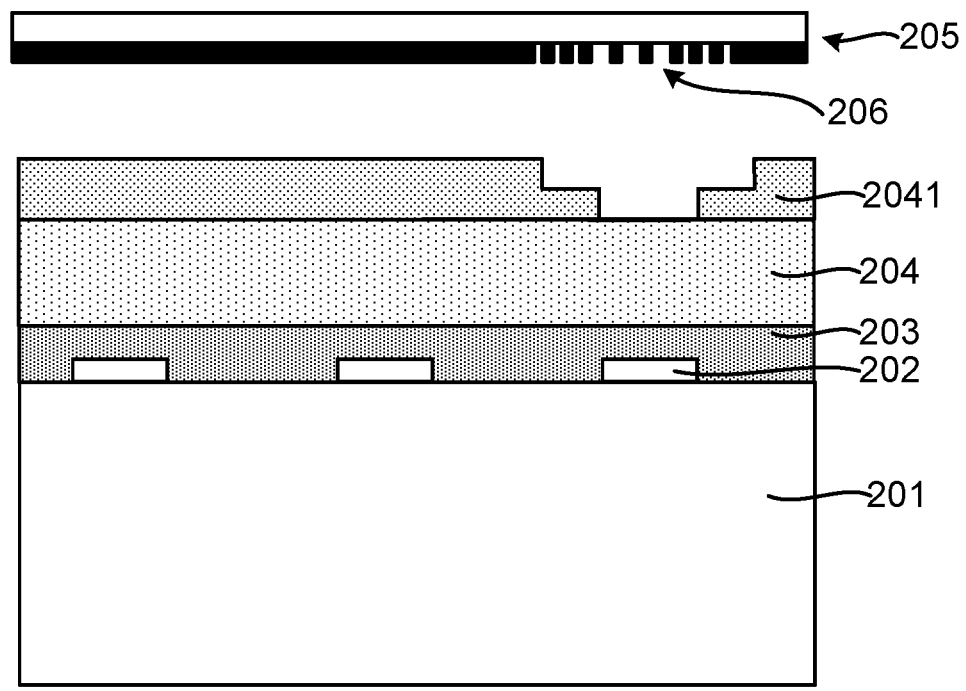

Next, as shown in FIG. 7, an organic film 204 is formed on the passivation layer 203. The material of the shrinking organic film is polyimide. Then, photoresist 2041 is coated on the organic film 204 and the photoresist 2041 is exposed with a gray-tone mask 205. On the gray-tone mask 205, slits 206 with different widths less than the size of pixel are arranged. Therefore, after the photoresist 2041 is exposed with the gray-tone mask 205, exposed parts with different exposure levels may be formed on the photoresist 2041, that is, different levels of exposure are formed on the photoresist 2041 and a part of the organic film is revealed.

Figure 8:
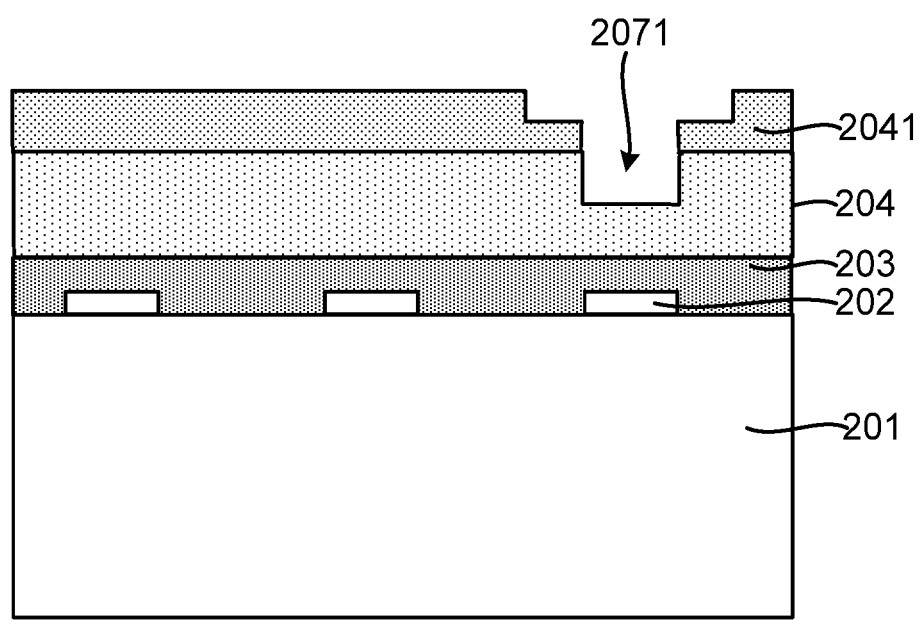

Next, as shown in FIG. 8, a first dry etching is performed on the organic film 204, so as to form a first etched recess 2071 on the organic film 204.

Figure 9:
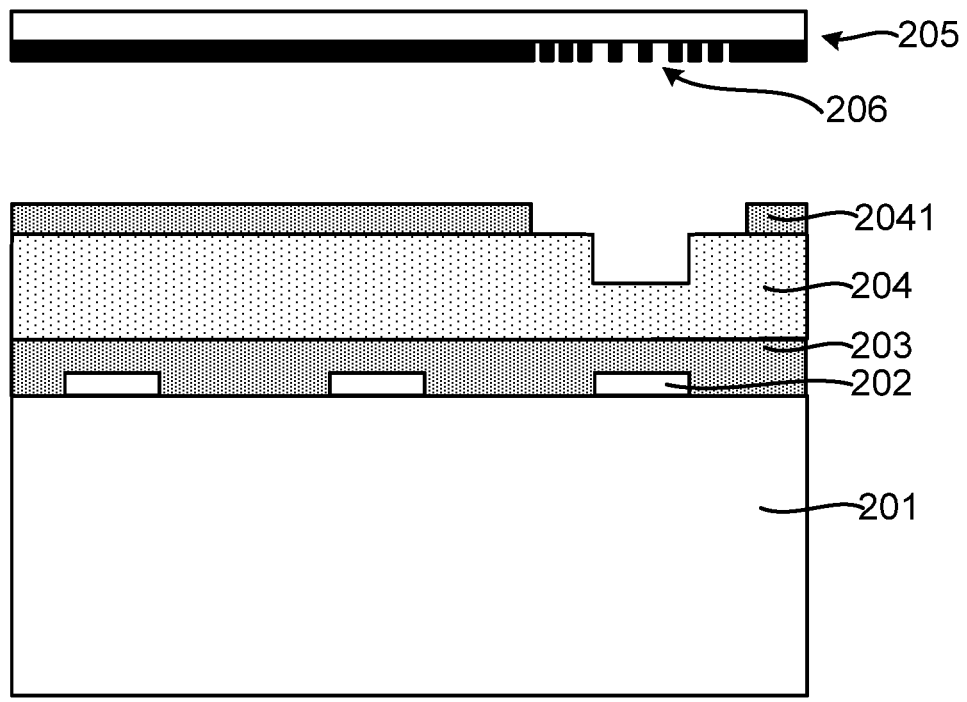

Next, as shown in FIG. 9, a second exposing is performed on the photoresist 2041 with the same gray-tone mask 205, and another part of the organic film 204 may be further revealed due to different exposure levels.

Figure 10:
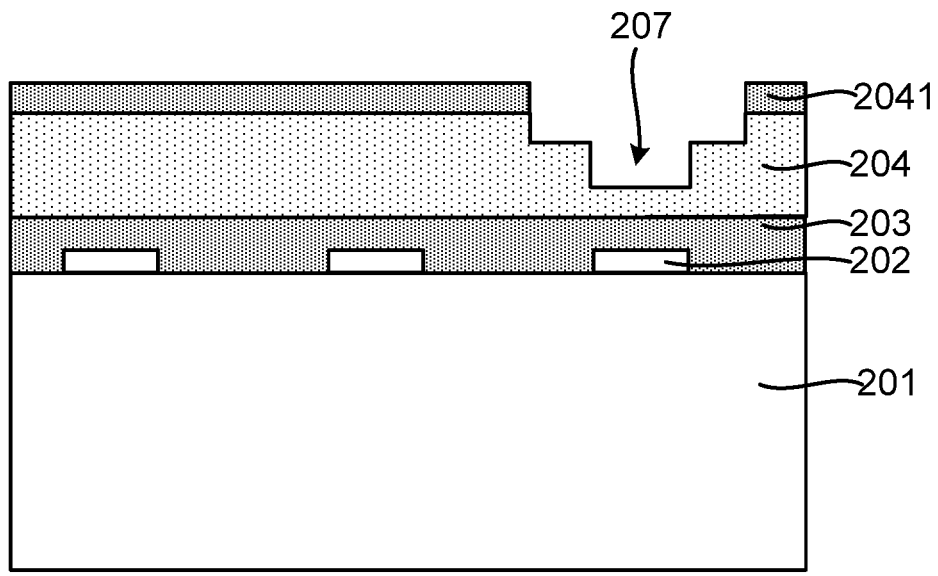

Next, as shown in FIG. 10, a second dry etching is further performed on the organic film 204 in addition to the first etched recess 2071. Accordingly, multiple recesses 207 with different depths are formed in the organic film 204.

Figure 11:
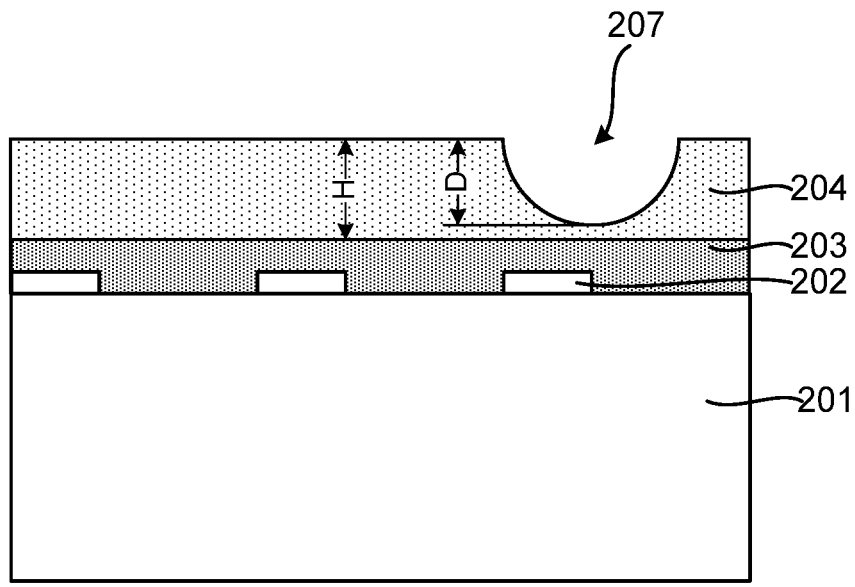

Next, as shown in FIG. 11, the residual of the photoresist 2041 is stripped off. Then the organic film 204 undergoes high-temperature baking under the temperature in a range of 180 to 220 degrees Celsius for a period of 10 mins to 15 mins. In the baked organic film 204, steps of the recess 207 may shrink under heat, therefore a smooth hemispherical or semi-ellipsoidal shape is formed. And since the recess 207 is formed in the organic film 204, the maximum depth D of the recess 207 should be less than or equal to the thickness H of the organic film 204.

Figure 12:
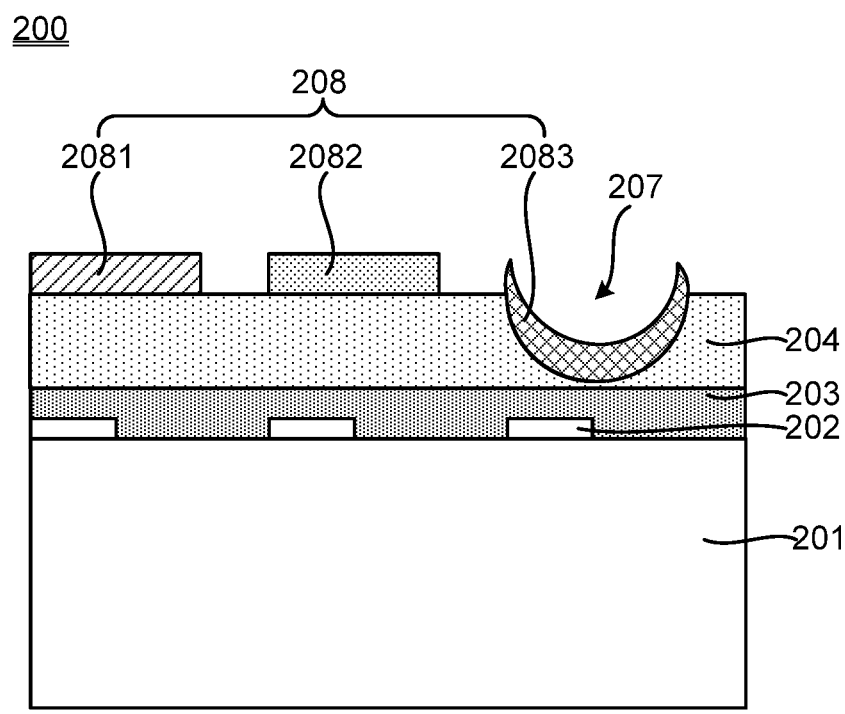

Next, as shown in FIG. 12, a plurality of pixels 208 are formed on the organic film 204. Each of the plurality of pixels 208 includes a red organic light emitting diode 2081, a green organic light emitting diode 2082 and a blue organic light emitting diode 2083. The blue organic light emitting diode 2083 is formed on the recess 207, and the surface area of the recess 207 is larger than or equal to the contact area of the red organic light emitting diode 2081 or the green organic light emitting diode 2082 with the organic film 204.

Each of the colored organic light emitting diodes, i.e. the red organic light emitting diode 2081, the green organic light emitting diode 2082 and the blue organic light emitting diode 2083 which are included in each pixel 208, includes a transparent anode layer formed on the organic film, a hole injection layer formed on the transparent anode layer, a hole transport layer formed on the hole injection layer, an organic light emitting layer formed on the hole transport layer, an electron transport layer formed on the organic light emitting layer, an electron injection layer formed on the electron transport layer and a cathode formed on the electron injection layer. The construction and the manufacture of the colored organic light emitting diodes are well known and will not be described herein.

So far, an active matrix organic light emitting diode (AMOLED) panel 200 as shown in FIG. 12 is formed, including the substrate 201, the organic film 204 formed on the substrate 201, and the plurality of pixels 208 formed on the organic film 204. Each of the pixels 208 includes the red organic light emitting diode 2081, the green organic light emitting diode 2082 and the blue organic light emitting diode 2083. A recess 207 is formed in the organic film 204 in the region corresponding to the blue organic light emitting diode 2083, the blue organic light emitting diode 2083 is formed on the recess 207, and the surface area of the recess 207 is larger than the contact area of the red organic light emitting diode 2081 or the green organic light emitting diode 2082 with the organic film 204.

Figure 3:
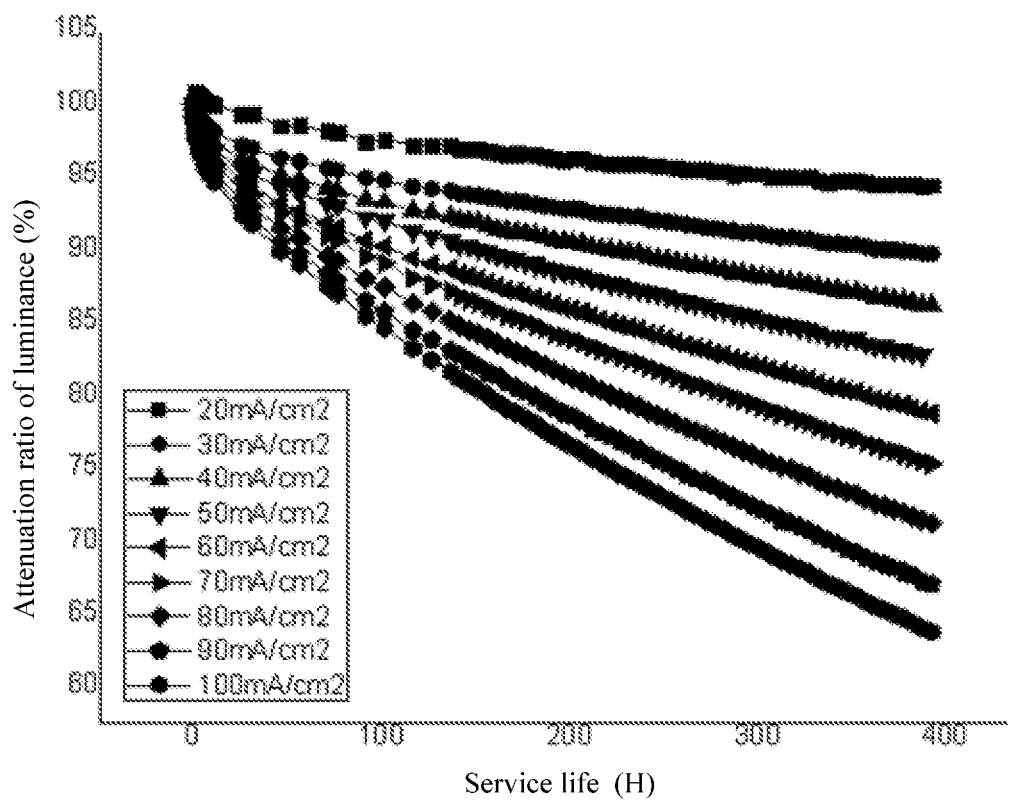
FIG. 3 is a diagram of the relation between the lifetime and the surface current density of the organic light emitting diode.
Figure 4:
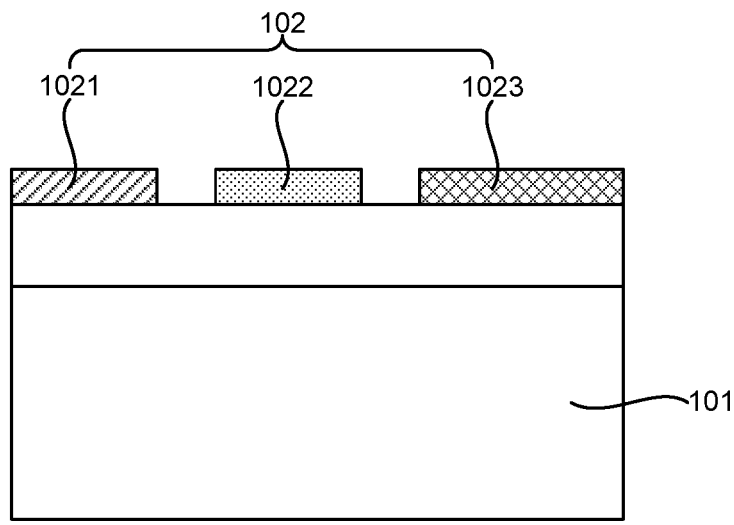
FIG. 4 is a schematic structural diagram of another active matrix organic light emitting diode panel in the prior art.

The blue organic light emitting diode 2083 is formed on the recess 207. According to the relation between the lifetime and the current density of the organic light emitting diode as shown in FIG. 3, it can be seen that the lifetime of the organic light emitting diode depends on the current density on the surface. That is to say, the lifetime of the blue organic light emitting diode 2083 depends on the surface area of the recess 207. The larger the surface area of the recess 207 is, the smaller the density of the current flowing through the blue organic light emitting diode 2083 is, and the longer the lifetime of the blue organic light emitting diode 2083 is. Therefore, it is just needed to increase the surface area of the recess 207 to prolong the lifetime of the blue organic light emitting diode 2083. In the case where the surface area of the recess 207 is larger than the contact area of the red organic light emitting diode 2081 or the green organic light emitting diode 2082 with the organic film 204, the lifetime of the blue organic light emitting diode 2083 may be prolonged.

It should be noted that the above arrangement of the organic light emitting diodes is only exemplary, and there may be various arrangements for the red organic light emitting diode 2081, the green organic light emitting diode 2082 and the blue organic light emitting diode 2083 to form a pixel, with the only condition that the contact area of the blue organic light emitting diode 2083 with the organic film is larger than the contact area of the red organic light emitting diode 2081 or the green organic light emitting diode 2082 with the organic film.

Figure 14:
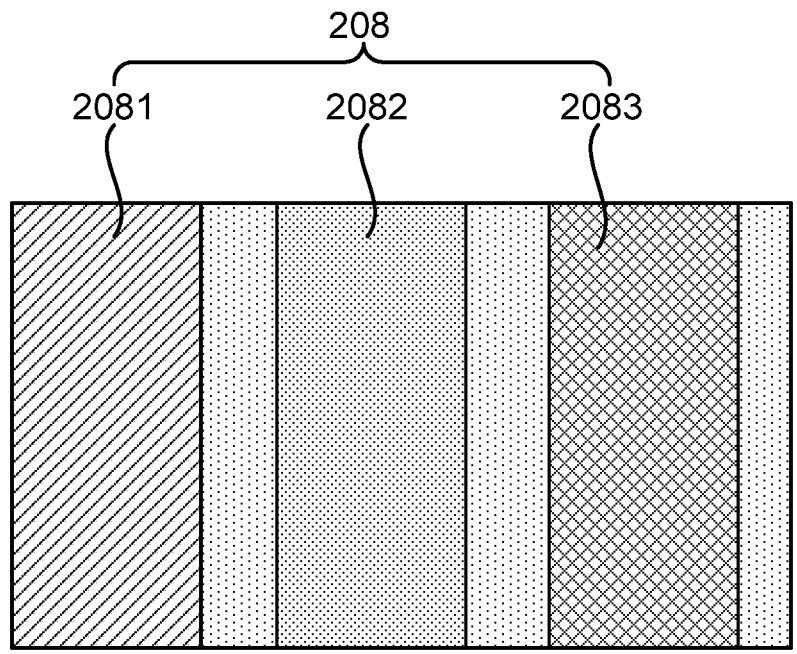
FIG. 14 is a top view of an active matrix organic light emitting diode panel according to an embodiment of the present disclosure.

As shown in FIG. 14, the opening area of the recess 207 may be less than or equal to the contact area of the red organic light emitting diode 2081 or the green organic light emitting diode 2082 with the organic film 204, to further improve the resolution of the active matrix organic light emitting diode panel 200. The resolution of the active matrix organic light emitting diode panel 200 depends on the size of the cross sectional of the pixel 208. The contact area of the red organic light emitting diode 2081 or the green organic light emitting diode 2082 with the organic film 204 is unchanged, while the opening area of the recess 207 is less than or equal to the contact area of the red organic light emitting diode 2081 or the green organic light emitting diode 2082 with the organic film 204. That is, the contact area of the blue organic light emitting diode 2083 with the organic film is less than or equal to the area of the surface where the red organic light emitting diode 2081 or the green organic light emitting diode 2082 contacts the organic film. Therefore, the size of the whole pixel 208 is reduced relatively, and the resolution of the whole active matrix organic light emitting diode panel 200 is improved.

Still referring to FIG. 11, the recess 207 in the embodiment is hemispherical. Of course, the shape of the recess 207 is not limited to be hemispherical and may be arbitrary shape with an opening area less than or equal to the area of the surface where the red organic light emitting diode 2081 or the green organic light emitting diode 2082 contacts the organic film 204, such as W-shaped, step-shaped or wedge-shaped. Recess of different shapes may be formed by employing different gray-tone masks 205. In the case where the boundary of the recess 207 is sharp, for example, for the W-shaped, step-shaped or wedge-shaped recess, the high-temperature baking may not be performed to maintain the sharp boundary of the recess 207.

In the present disclosure, the contact area of the blue organic light emitting diode with the organic film is larger than the contact area of the red or green organic light emitting diode with the organic film, thereby the service life of the blue organic light emitting diode is prolonged. For this purpose, the blue organic light emitting diode is formed on the recess for which the surface area is larger than the contact area of the red or green organic light emitting diode with the organic film in this embodiment. It should be understood that, in another embodiment of the present disclosure, the recess may be replaced with a protrusion. As long as the surface area of the protrusion is larger than the contact area of the red or green organic light emitting diode with the organic film and the blue organic light emitting diode is formed on the protrusion, the lifetime of the blue organic light emitting diode can also be prolonged. Similarly, the protrusion may be hemispherical, M-shaped or wedge-shaped. In addition, the bottom surface area of the protrusion may be less than or equal to the contact area of the red or green organic light emitting diode with the organic film to further improve the resolution of the active matrix organic light emitting diode panel.

It should be noted that a recess or protrusion may also be formed in the organic film at the place corresponding to the red organic light emitting diode 2081 and/or the green organic light emitting diode 2082, under the condition that the contact area of the blue organic light emitting diode 2083 with the organic film is larger than the contact area of the red organic light emitting diode 2081 or the green organic light emitting diode 2082 with the organic film.

Figure 1:
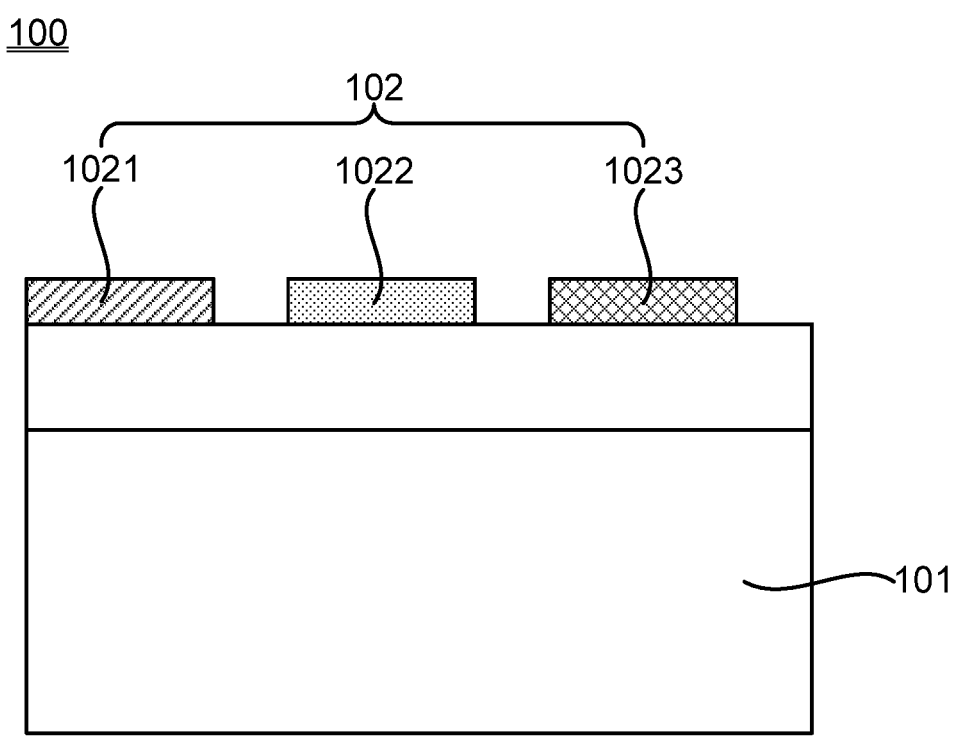
FIG. 1 is a schematic structural diagram of an active matrix organic light emitting diode panel in the prior art.
Figure 2:
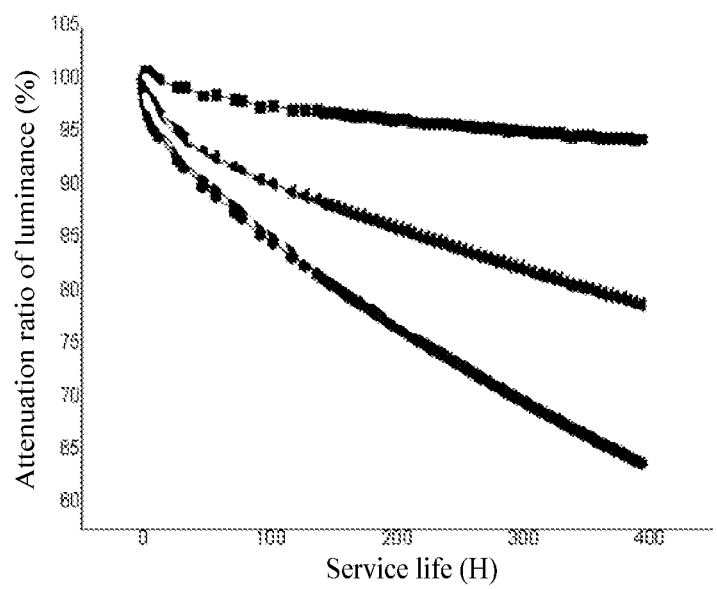
FIG. 2 is a diagram of lifetimes of the red, green and blue organic light emitting diodes.
Figure 13:
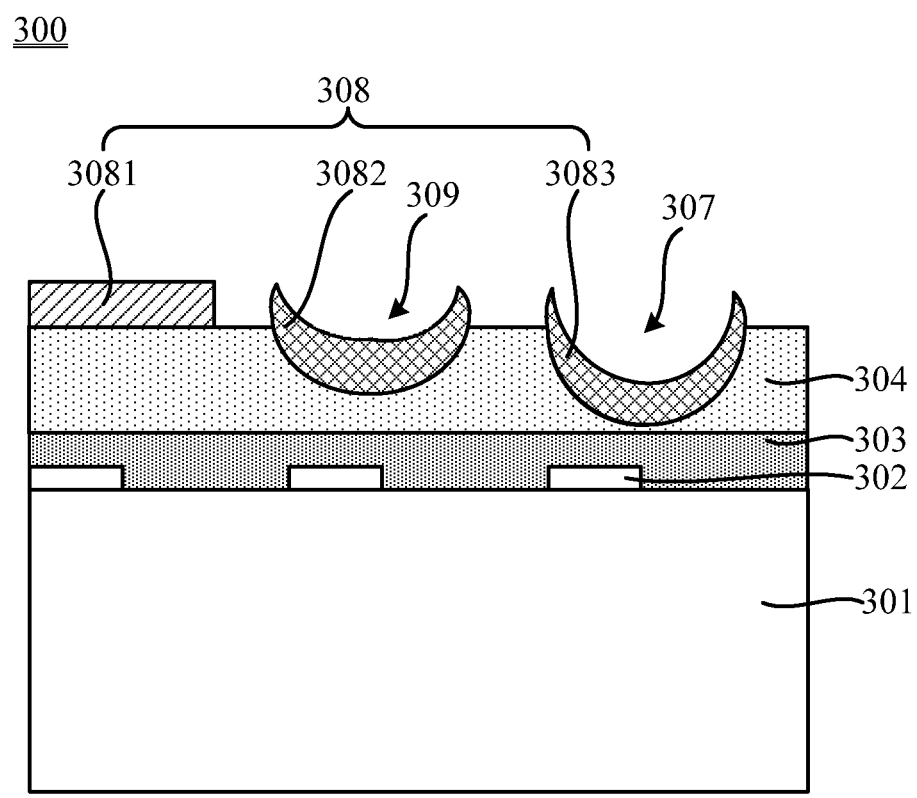
FIG. 13 is a schematic structural diagram of an active matrix organic light emitting diode panel according to another embodiment of the present disclosure.

The lifetime of the green organic light emitting diode is longer than that of the blue organic light emitting diode but is shorter than that of the red organic light emitting diode, as shown in FIG. 2. Accordingly, in another embodiment of the present disclosure, both the blue and green organic light emitting diodes are formed on recesses or protrusions, where the surface area of the recess or protrusion for the blue organic light emitting diode is larger than the surface area of the recess or protrusion for the green organic light emitting diode. As shown in FIG. 13, an active matrix organic light emitting diode panel 300 is formed, including the substrate 301, the organic film 304 formed on the substrate 301, and the plurality of pixels 308 formed on the organic film 304. Each of the pixels 308 includes the red organic light emitting diode 3081, the green organic light emitting diode 3082 and the blue organic light emitting diode 3083. A first recess 307 and a second recess 309 are formed in the organic film 304 in the region corresponding to the blue organic light emitting diode 3083 and the green organic light emitting diode 3082, respectively. The blue organic light emitting diode 3083 is formed on the first recess 307, and the contact area of the blue organic light emitting diode 3083 with the organic film is larger than the contact area of the red organic light emitting diode 3081 with the organic film 304 and is further larger than the contact area of the green organic light emitting diode 3082 with the organic film 304. The green organic light emitting diode 3082 is formed on the second recess 309, and the contact area of the green organic light emitting diode 3082 with the organic film is larger than the contact area of the red organic light emitting diode 3081 with the organic film 304 but is smaller than the contact area of the blue organic light emitting diode 3083 with the organic film 304.

The blue organic light emitting diode 3083 and the green organic light emitting diode 3082 are formed on the first recess 307 and the second recess 309 respectively. FIG. 3 shows the relationship between the decreasing lifetime and the increasing current density of the organic light emitting diode. The lifetime of the blue organic light emitting diode 3083 depends on the surface area of the first recess 307 and the lifetime of the green organic light emitting diode 3082 depends on the surface area of the second recess 309. One can apply the same amount of total power to the blue or green diodes, the current density flowing through the organic light emitting diode decreases from the larger surface area of the recess or protrusion, resulting in prolonged lifetime of the organic light emitting diode. Specifically, the surface area of the first recess 307 and the second recess 309 are both increased to benefit the lifetime of the green organic light emitting diode 3082, similarly as in the case of blue OLED 3083.

In summary, in the active matrix organic light emitting diode panels provided in the embodiments of the present disclosure, the recess or protrusion is formed in the organic film in the region corresponding to the blue and/or green organic light emitting diode, the blue and/or green organic light emitting diode is formed on the recess or protrusion, and the surface area of the recess or protrusion is larger than the contact area of the red organic light emitting diode with the organic film. Therefore, the contact area of the blue and/or green organic light emitting diode with the organic film is increased and the lifetime of the blue and/or green organic light emitting diode is prolonged. Since the increasing in the contact area of the blue and/or green organic light emitting diode may be implemented simply by increasing the surface area of the recess or protrusion without increasing the opening area of the recess or the bottom surface area of the protrusion, the size of the pixel can be maintained as it is, that is, the contact area of the blue and/or green organic light emitting diode with the organic film is increased without changing the resolution, so that the service life of the whole AMOLED is improved.

The above describes increasing the contact area of the blue and/or green organic light emitting diode with the organic film to prolong the lifetime of the blue and/or green organic light emitting diode. Following will describe how to determine the proportion of the contact areas of the red, green and blue organic light emitting diodes, to obtain a good service life of the whole AMOLED.

The lifetime of the organic light emitting diode may correlate luminance attenuation of the organic light emitting diode. Based on the law of luminance attenuation, the luminance of the organic light emitting diode may be calculated using the following equation (1) which simulates luminance attenuated with time:

$$L(t) = L_0 \exp\left[-\left(\frac{t}{a}\right)^{1/n}\right] \quad (1)$$

wherein t represents running time of the organic light emitting diode; L(t) represents the luminance of the organic light emitting diode at time t; $L_0$ represents the initial luminance of the organic light emitting diode, i.e., the initial value of L(t); a is a constant; and n is an accelerating factor which reflects attenuation rate of the luminance with time.

Equation (2) can be derived from equation (1):

$$ln[ln(L_0/L(t))] = 1/n \ln(t) - 1/n \ln(a) \quad (2)$$

The relation between luminance attenuation, i.e., lifetime, of the organic light emitting diode and the luminance of the organic light emitting diode can be obtained from equations (1) and (2), and by calculating different lifetime and luminance $L(t_1)$ and $L(t_2)$ using $t_1$ and $t_2$, the luminance attenuation, i.e., lifetime, of the organic light emitting diode may be represented as following equations (3) and (4):

$$Lifetime_1 = \ln\left(\frac{L(t_1)}{L_0}\right) = -\left(\frac{t_1}{a}\right)^{\frac{1}{n}} \quad (3)$$

$$Lifetime_2 = \ln\left(\frac{L(t_2)}{L_0}\right) = -\left(\frac{t_2}{a}\right)^{\frac{1}{n}} \quad (4)$$

$Lifetime_1$ represents the lifetime of the organic light emitting diode in a case that the luminance is $L(t_1)$; and $Lifetime_2$ represents the lifetime of the organic light emitting diode in a case that the luminance is $L(t_2)$.

From the above, the relationship between the lifetime and the luminance of the organic light emitting diode is obtained in the following equation (5):

$$Lifetime_1 = Lifetime_2\left(\frac{L_2}{L_1}\right)^n \quad (5)$$

FIG. 3 illustrates n experimental graph of lifetime attenuation curves of the organic light emitting diode at different current densities. The graph illustrates data obtained from experiments. The graph shows that the greater the current density is, the faster the lifetime attenuation is. In view of the linear relationship between the luminance and the current density, the greater the luminance is, the faster the lifetime attenuation is.

FIG. 3 illustrates lifetime attenuation as a function of illumination current density from 20 mA/cm2, 30 mA/cm2 . . . to 100 mA/cm2 obtained from experiments. From these curves, the value of n is calculated to be about 1.5 according to the above equations. Preferably, the value of n is 1.4-1.6. Following is an example taking n as 1.5.

The relationship between the lifetime ratio and the luminance ratio is further derived as:

$$\frac{Lifetime_1}{Lifetime_2} = \left(\frac{L_2}{L_1}\right)^{1.5} \quad (6)$$

In an embodiment, it is assumed that the original contact area $S_{b0}$ of the blue organic light emitting diode with the organic film is equal to the original contact area $S_{r0}$ of the red organic light emitting diode with the organic film. Enlarging the contact area of the blue organic light emitting diode with the organic film will prolong the lifetime of the blue organic light emitting diode, matching the lifetime of the blue organic light emitting diode with the lifetime of the red organic light emitting diode, and thus to prolong the overall lifetime of the whole OLED panel. Specifically, $Lifetime_r = Lifetime_b$ is achieved.

Taking the lifetime of the red organic light emitting diode as reference, we make $Lifetime_{b1} = Lifetime_{r0}$, wherein $Lifetime_{b1}$ is the lifetime of the blue organic light emitting diode at the enlarged contact area $S_{b1}$, and Lifetime$_{r0}$ is the lifetime of the red organic light emitting diode at the original contact area $S_{r0}$. Then equation (7) can be obtained:

$$\frac{Lifetime_{b0}}{Lifetime_{r0}} = \left(\frac{L_{r0}}{L_{b0}}\right)^{1.5} \quad (7)$$

wherein Lifetime$_{b0}$ is the lifetime of the blue organic light emitting diode at the original contact area $S_{b0}$; $L_{r0}$ is the initial luminance of the red organic light emitting diode at the original contact area $S_{r0}$; and $L_{b0}$ is the initial luminance of the blue organic light emitting diode at the original contact area $S_{b0}$.

In addition, following equation (8) can be obtained:

$$\frac{Lifetime_{b0}}{Lifetime_{b1}} = \left(\frac{L_{b1}}{L_{b0}}\right)^{1.5} = \left(\frac{J_{b1} \cdot E_{b1}}{J_{b0} \cdot E_{b0}}\right)^{1.5} = \left(\frac{I_{b1} \cdot E_{b1} \cdot S_{b0}}{I_{b0} \cdot E_{b0} \cdot S_{b1}}\right)^{1.5} \quad (8)$$

wherein $L_{b1}$ is the initial luminance of the blue organic light emitting diode at the enlarged contact area $S_{b1}$; $J_{b0}$ is the current density of the blue organic light emitting diode at the original contact area $S_{b0}$; $J_{b1}$ is the current density of the blue organic light emitting diode at the enlarged contact area $S_{b1}$; $E_{b0}$ is the current efficiency of the blue organic light emitting diode at the original contact area $S_{b0}$; $E_{b1}$ is the current efficiency of the blue organic light emitting diode at the enlarged contact area $S_{b1}$; $I_{b0}$ is the current of the blue organic light emitting diode at the original contact area $S_{b0}$; and $I_{b1}$ is the current of the blue organic light emitting diode at the enlarged contact area $S_{b1}$.

Because the current efficiency E of the organic light emitting diode is the same and the panel current I of the organic light emitting diode is the same in a same processing, following equation (9) and (10) can be obtained:

$$\frac{Lifetime_{b0}}{Lifetime_{b1}} = \left(\frac{S_{b0}}{S_{b1}}\right)^{1.5} \quad (9)$$

That is, $$\frac{Lifetime_{b0}}{Lifetime_{r0}} = \left(\frac{S_{b0}}{S_{b1}}\right)^{1.5} \quad (10)$$

Because the lifetime of the red and blue organic light emitting diodes at the original contact area can be obtained by test, the enlarged contact area at which the lifetime of the blue organic light emitting diode can be matched with the lifetime of the red organic light emitting diode can be obtained as follows:

$$S_{b1} = \frac{S_{b0}}{\sqrt[1.5]{\frac{Lifetime_{b0}}{Lifetime_{r0}}}} \quad (11)$$

$$\text{i.e., } S_{b1} = \frac{S_{r0}}{\sqrt[1.5]{\frac{Lifetime_{b0}}{Lifetime_{r0}}}} \quad (12)$$

In this way, we can obtain how much the contact area of the blue organic light emitting diode should be enlarged with respect to the contact area of the red organic light emitting diode.

In addition, the lifetime of the green organic light emitting diode is greater than the lifetime of the blue organic light emitting diode but is shorter than the lifetime of the red organic light emitting diode at the same contact area, as shown in FIG. 2. Therefore, in another embodiment of the disclosure, both the contact area of the blue organic light emitting diode and the contact area of the green organic light emitting diode are enlarged, to make the lifetime of the blue, green and red organic light emitting diodes be matched with each other.

Specifically, Lifetime$_{r0}$=Lifetime$_{g1}$=Lifetime$_{b1}$ is also achieved.

Similar as the above analysis, we can obtain how much the contact area of the green organic light emitting diode should be enlarged with respect to the red organic light emitting diode:

$$S_{g1} = \frac{S_{g0}}{\sqrt[1.5]{\frac{Lifetime_{g0}}{Lifetime_{r0}}}} \quad (13)$$

$$\text{i.e., } S_{g1} = \frac{S_{r0}}{\sqrt[1.5]{\frac{Lifetime_{g0}}{Lifetime_{r0}}}} \quad (14)$$

From equations (12) and (14), the enlarged contact areas of the blue and green organic light emitting diodes can be obtained. The various organic light emitting diodes then can be layout in conjunction with allowable pitch range of pixel.

Figure 15:
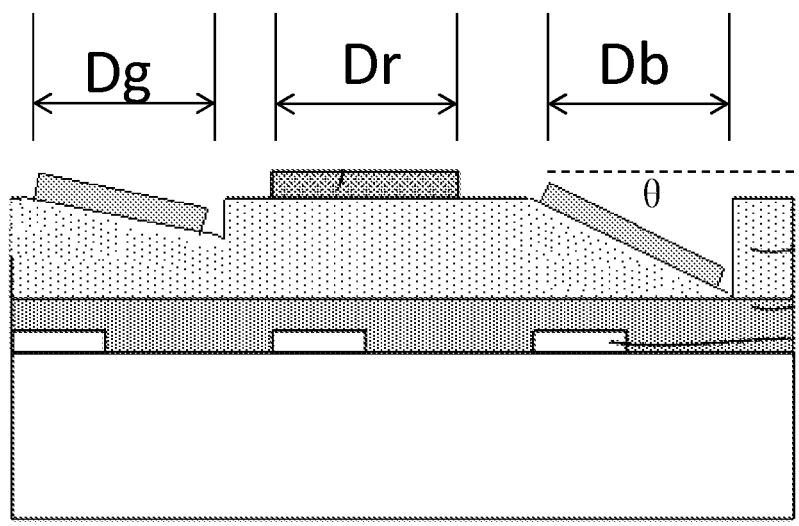
FIG. 15 is a method for enlarging the contact area between organic light emitting diode and the organic film according to an embodiment of the present disclosure.

FIG. 15 illustrates another method for enlarging the contact area of the organic emitting diode with the organic film according to an embodiment of the disclosure. In FIG. 15, the contact area of the organic emitting diode with the organic film is enlarged by forming a slope in the organic film.

In the embodiment, $D_r=D_g=D_b$ is maintained, i.e., the lengths of the red, green and blue organic emitting diodes in the horizontal direction are equal, as shown in FIG. 15.

In this case, the contact area of the blue organic emitting diode with the organic film is $S_b=M_b*D_b/\cos\grave{e}_b$, wherein $M_b$ is the length of the blue organic emitting diode in the vertical direction; $D_b$ is the length of the blue organic emitting diode in the horizontal direction; and $\grave{e}_b$ is the angle of the blue organic emitting diode with respect to the horizontal direction.

Similarly, the contact area of the green organic emitting diode with the organic film is $S_g=M_g*D_g/\cos\grave{e}_g$, wherein $M_g$ is the length of the green organic emitting diode in the vertical direction; $D_g$ is the length of the blue organic emitting diode in the horizontal direction; and $\grave{e}_g$ is the angle of the green organic emitting diode with respect to the horizontal direction.

From the above, different slopes can be obtained by adjusting è and M, to achieve varying lifetimes of the red, green and blue organic emitting diodes.

In the embodiment, the lengths of the red, green and blue organic emitting diodes in the horizontal direction are equal. In this way, the length of the contact area in the horizontal direction is not elongated, thus the resolution is not deteriorated while increasing the lifetime of the OLED panel. In addition, the evaporation mask can be commonly used by just transforming in view that the three organic emitting diodes have the same horizontal length. In addition, the color displaying effect is good when the lengths of the red, green and blue organic emitting diodes in the horizontal direction are equal, and display distortion due to large $D_g$ or $D_b$ can be avoided. In addition, the illumination density, and the resulting pixel resolution are kept the same for all red, green and blue colors.

In other embodiment of the disclosure, spherical surface, cambered surface, convex surface or concave surface can also be used, and the principle for shape adjusting and surface calculating is similar as the above slope surface.

In an embodiment, the layer of the organic light emitting diode and the layer of the cathode are evaporated in a same process. In this case, these layers may form corresponding radian along with the below layer, so the thickness is not changed and the microcavity adjusting can follow the conditions of the originally designed film thickness (i.e., microcavity length) of the organic light emitting diode. In addition, considering process precision, the cathode of the organic light emitting diode may be thinned, to weaken the microcavity effect; or material with good electrical conductivity and good transparency, such as IZO, is used to form the cathode, to ensure the performance of the organic light emitting diode and weaken the microcavity effect (due to the good transparency of IZO), so as to achieve a good effect as a whole.

In an embodiment, a convex surface or a concave surface in the organic film is used, then the layer of the organic light emitting diode will also have a convex surface or a concave surface along with the shape of the organic film in an evaporation process. In this way, the contact area of the organic light emitting diode is increased and the lifetime attenuation of the organic light emitting diode is adjusted. A printing manner such as an ink jet printing can also be used to achieve a similar effect.

In addition, since the red, green and blue organic light emitting diodes are fabricated with different materials, chroma excursion of white dot due to unbalanced lifetime attenuation will occur. This issue can also be relieved or resolved in the embodiments of the disclosure.

Different embodiments are described above. It can be understood that these embodiment can be combined with each other arbitrarily when there is no conflict. It is obvious that various changes and modifications may be made to the present invention by those skilled in the art without departing from the spirit and the scope of the present invention. Therefore, the changes and modifications within the scope of claims of the present invention and its equivalents are included in the present invention.

What is claimed is:

1. An active matrix organic light emitting diode panel, comprising:
   a substrate;
   a patterned layer comprising thin film transistors (TFTs) on the substrate, divided into red, green, and blue regions;
   a passivation layer disposed on the patterned layer;
   an organic film formed on the passivation layer; and
   red, green and blue organic light emitting diodes formed on the organic film, aligning to the red, green, and blue regions respectively;
   wherein, the red organic light emitting diode is aligned to the red region, wherein the organic film above the red region is flat and has no recess;
   wherein a first recess is formed on the surface of the organic film above the blue region, and wherein the blue organic light emitting diode is formed on the first recess,
   wherein a contact area of the blue organic light emitting diode with the organic film is larger than a contact area of the red organic light emitting diode with the organic film; and
   wherein the contact area of the blue organic light emitting diode with the organic film is $$\frac{1}{\sqrt[n]{\frac{Lifetime_{b0}}{Lifetime_{r0}}}}$$

times as great as the contact area of the red organic light emitting diode with the organic film, wherein $S_{r0}$ represents the contact area of the red organic light emitting diode with the organic film, $Lifetime_{r0}$ represents a lifetime of the red organic light emitting diode in a case that the contact area of the red organic light emitting diode with the organic film is $S_{r0}$; $Lifetime_{b0}$ represents a lifetime of the blue organic light emitting diode in a case that the contact area of the blue organic light emitting diode with the organic film is $S_{r0}$; and n is a value ranging from 1.4 to 1.6.

2. The active matrix organic light emitting diode panel according to claim 1, wherein a second recess is formed in the organic film in the green region, and wherein the green organic light emitting diode is formed on the second recess, and wherein a contact area of the green organic light emitting diode with the organic film is larger than the contact area of the red organic light emitting diode with the organic film; wherein the wherein a contact area of the green organic light emitting diode with the organic film is $$\frac{1}{\sqrt[n]{\frac{Lifetime_{g0}}{Lifetime_{r0}}}}$$

times as great as the contact area of the red organic light emitting diode with the organic film, wherein $Lifetime_{g0}$ represents a lifetime of the green organic light emitting diode in a case that the contact area of the green organic light emitting diode with the organic film is $S_{r0}$.

3. The active matrix organic light emitting diode panel according to claim 1, wherein an opening area of the first recess is equal to the contact area of the red organic light emitting diode with the organic film.

4. The active matrix organic light emitting diode panel according to claim 2, wherein an opening area of the first recess and an opening area of the second recess each is equal to the contact area of the red organic light emitting diode with the organic film.

5. The active matrix organic light emitting diode panel according to claim 1, wherein the first recess is wedge-shaped, W-shaped or hemispherical.

6. The active matrix organic light emitting diode panel according to claim 3, wherein a depth of the first recess is less than or equal to a thickness of the organic film.

7. A method for manufacturing an active matrix organic light emitting diode panel, comprising:

providing a substrate;

forming an organic film on the substrate;

exposing the organic film with a gray-tone mask;

etching to remove part of the organic film and forming a first recess on the organic film; and forming red, green and blue organic light emitting diodes on the organic film aligning to a red, a green, and a blue regions in the organic film respectively;

wherein the blue organic light emitting diode is formed on the first recess in the organic film aligned to the blue region, wherein the organic film above the red region is flat and has no recess, wherein a contact area of the blue organic light emitting diode with the organic film is larger than a contact area of the red organic light emitting diode with the organic film; and wherein the contact area of the blue organic light emitting diode with the organic film is $$\frac{1}{\sqrt[n]{\frac{Lifetime_{b0}}{Lifetime_{r0}}}}$$

times as great as the contact area of the red organic light emitting diode with the organic film, wherein the $S_{r0}$ represents the contact area of the red organic light emitting diode with the organic film, $Lifetime_{r0}$ represents a lifetime of the red organic light emitting diode in a case that the contact area of the red organic light emitting diode with the organic film is $S_{r0}$; $Lifetime_{b0}$ represents a lifetime of the blue organic light emitting diode in a case that the contact area of the blue organic light emitting diode with the organic film is $S_{r0}$; and n is a value ranging from 1.4 to 1.6.

8. The method for manufacturing the active matrix organic light emitting diode panel according to claim 7, further comprising forming a second recess on the organic film, wherein the green organic light emitting diode is formed on the second recess, and wherein a contact area of the green organic light emitting diode with the organic film is larger than the contact area of the red organic light emitting diode with the organic film; wherein the contact area of the green organic light emitting diode with the organic film is $$\frac{1}{\sqrt[n]{\frac{Lifetime_{g0}}{Lifetime_{r0}}}}$$

times as great as the contact area of the red organic light emitting diode with the organic film, wherein $Lifetime_{g0}$ represents a lifetime of the green organic light emitting diode in a case that the contact area of the green organic light emitting diode with the organic film is $S_{r0}$.

9. The method for manufacturing the active matrix organic light emitting diode panel according to claim 7, wherein an opening area of the first recess is equal to the contact area of the red organic light emitting diode with the organic film.

10. The method for manufacturing the active matrix organic light emitting diode panel according to claim 8, wherein an opening area of the first recess and an opening area of the second recess each is equal to the contact area of the red organic light emitting diode with the organic film.

11. The method for manufacturing the active matrix organic light emitting diode panel according to claim 7, wherein the first recess is wedge-shaped, W-shaped or hemispherical.

12. The method for manufacturing the active matrix organic light emitting diode panel according to claim 7, wherein a depth of the first recess is less than or equal to a thickness of the organic film.

13. The method for manufacturing the active matrix organic light emitting diode panel according to claim 7, wherein, before forming the organic film on the substrate, the method further comprises:

forming a plurality of thin-film transistors on the substrate; and forming a passivation layer on the thin-film transistor.

* * * * *